United States Patent [19]

Matsukawa et al.

[11] Patent Number: 4,610,078

[45] Date of Patent: Sep. 9, 1986

[54] METHOD OF MAKING HIGH DENSITY DIELECTRIC ISOLATED GATE MOS TRANSISTOR

[75] Inventors: Naohiro Matsukawa, Kamakura; Hiroshi Nozawa, Yokohama, both of Japan

[73] Assignee: Kabushiki Kaisha Toshiba, Kawasaki, Japan

[21] Appl. No.: 684,750

[22] Filed: Dec. 21, 1984

[30] Foreign Application Priority Data

Mar. 16, 1984 [JP] Japan .................................. 59-50619

[51] Int. Cl.$^4$ ................... H01L 21/308; H01L 21/265
[52] U.S. Cl. ..................................... 29/576 B; 29/571; 148/1.5; 148/187; 148/DIG. 82; 357/91
[58] Field of Search ............... 29/576 B, 571; 148/1.5, 148/187; 357/23, 91

[56] References Cited

U.S. PATENT DOCUMENTS

| | | | |
|---|---|---|---|
| 4,366,613 | 1/1983 | Ogura et al. | 29/576 B |
| 4,419,142 | 12/1983 | Matsukawa | 29/571 |
| 4,435,446 | 3/1984 | Marston et al. | 29/577 C |
| 4,441,941 | 4/1984 | Nozawa | 148/187 |
| 4,471,524 | 9/1986 | Kinsbron | 29/571 |
| 4,488,348 | 12/1984 | Jolly | 29/571 |
| 4,494,304 | 1/1985 | Yoshioka | 29/571 |

OTHER PUBLICATIONS

Matsukawa et al., "Selective Polysilicon Oxidation Technology for VLSI Isolation," IEEE Transactions on Electron Devices, vol. Ed-29, No. 4, Apr. 1982.

*Primary Examiner*—Upendra Roy
*Attorney, Agent, or Firm*—Finnegan, Henderson, Farabow, Garrett & Dunner

[57] ABSTRACT

There is disclosed a method of manufacturing a semiconductor device comprising a step of forming an isolation film having a patterned hole on a major surface of a semiconductor substrate of a P conductivity type, the wall of the isolation film defining the patterned hole having a large step, a step of forming a polysilicon layer on the major surface of the structure, a step of forming a first interlaid $SiO_2$ layer on the polysilicon layer, a step of patterning the $SiO_2$ layer and polysilicon layer using reactive ion etching process, thereby forming on the region of the substrate a gate electrode and a first $SiO_2$ film superposed thereon, the continuous side wall of the gate electrode and first $SiO_2$ film having a large step, a step of implanting an impurity ion into the substrate using the first $SiO_2$ film as a mask, thereby forming an impurity diffused region of an N conductivity type in the substrate, a step of forming a second interlaid $SiO_2$ layer on the major surface of the structure, and a step of applying reactive ion etching to the second $SiO_2$ layer, thereby forming a contact hole in the second $SiO_2$ layer leading to the impurity diffused region, while leaving part of the second $SiO_2$ layer on the side walls of said isolation film, gate electrode and first $SiO_2$ film.

4 Claims, 12 Drawing Figures

F I G. 2
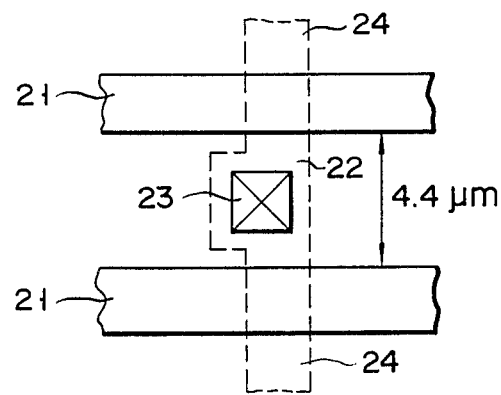
F I G. 3
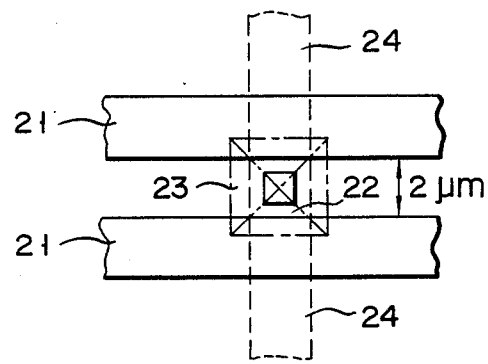

METHOD OF MAKING HIGH DENSITY DIELECTRIC ISOLATED GATE MOS TRANSISTOR

BACKGROUND OF THE INVENTION

This invention relates to a method of manufacturing a semiconductor device, in particular, to an improved method of forming a contact hole.

Conventionally, in order to contact a metal film with a semiconductor substrate, an interlaid insulating layer is patterned so that a contact hole is formed. Thereafter, aluminium is deposited over the major surface of the structure, to form an aluminium film thereon. In the deposition step, aluminium is deposited on the exposed surface of the substrate through the contact hole. Next, the aluminium film is patterned so that an aluminium electrode or wiring contacting the substrate through the contact hole is formed.

However, with the prior art manufacturing method, some margin is required for the semiconductor substrate in forming the contact hole in order to compensate the displacement on masking at the lithography process. This lowers the packing density of elements formed in the semiconductor device.

SUMMARY OF THE INVENTION

This invention has been achieved under the above-mentioned circumstances, and has as its object to provide a method of manufacturing a semiconductor device in which the margin required for the semiconductor wafer at the step of forming the contact hole is reduced as much as possible, thereby increasing the packing density of elements in the semiconductor wafer.

According to the invention, there is provided a method of manufacturing a semiconductor device comprising:
- a step of forming an isolation film having a patterned hole on a major surface of a semiconductor substrate of a first conductivity type, the patterned hole defining a region on the substrate where an active element is formed later, the side wall of the isolation film, which defines the patterned hole, having a large step;
- a step of forming a gate insulating film on said region of said substrate;
- a step of forming an electrically conductive layer over the major surface of the structure;
- a step of forming a first interlaid insulating layer on the conductive film;
- a step of patterning said first insulating layer and conductive layer using a reactive ion etching process, thereby forming on said region of the substrate a gate electrode and a first insulation film superposed thereon, the continuous side wall of the gate electrode and first insulation film having a large step;
- a step of implanting an impurity ion into the substrate using said first insulating film as a mask, thereby forming an impurity diffused region of a second conductivity type in said substrate;
- a step of forming a second interlaid insulating layer over the major surface of the structure;
- a step of applying a reactive ion etching to said second insulating layer, thereby forming a contact hole in the second insulating layer leading to said impurity diffused region, while leaving part of the second insulating layer on the side walls of said isolating film, gate electrode and first insulating film; and
- a step of forming an electrically conductive film in contact with said impurity diffused region.

BRIEF DESCRIPTION OF THE DRAWINGS

FIG. 2 shows a pattern of a portion of the semiconductor device manufactured by a prior art manufacturing method; and FIG. 3 shows a pattern of a portion of the semiconductor device manufactured according to this invention.

DETAILED DESCRIPTION OF THE PREFERRED EMBODIMENT

There will now be described a manufacturing method of a semiconductor device according to an embodiment of the invention with reference to FIGS. 1A to 1J.

Figure 1A:
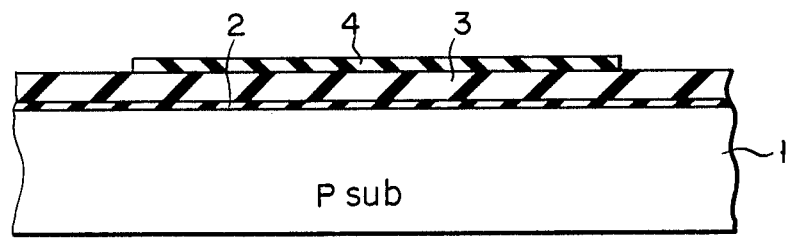
FIGS. 1A to 1J show cross sections of a semiconductor device during the manufacturing process, in which a manufacturing method according to an embodiment of the invention is applied.

Process 1 (FIG. 1A)

A P conductivity type silicon substrate or wafer 1 is prepared. Then, a thermal oxidation layer 2 is formed over a major surface of the substrate 1. After that, polysilicon is deposited on the oxidation layer 2, thereby forming a polysilicon layer 3 on the oxidation layer 2. Next, a patterned silicon nitride ($Si_3N_4$) film 4 is formed on the polysilicon layer 3 using a chemical vapor deposition (CVD) process and a photoengraving (PE) process.

Figure 1B:
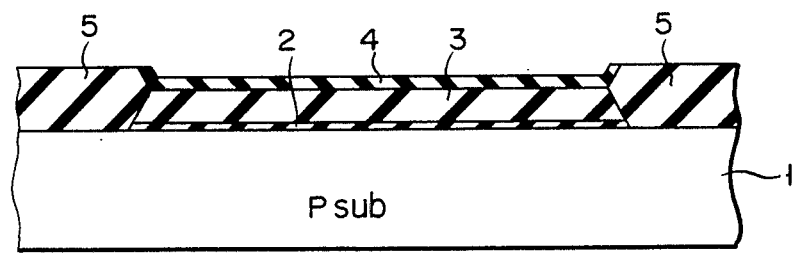

Process 2 (FIG. 1B).

The polysilicon layer 3 is locally oxidized by a thermal oxidizing process using silicon nitride film 4 as an antioxidizing mask, thereby oxidizing the part 5 of the polysilicon layer 3 adjacent silicon nitride film 4. The oxidized part 5 is thick and about 5,000 Å in thickness.

Figure 1C:
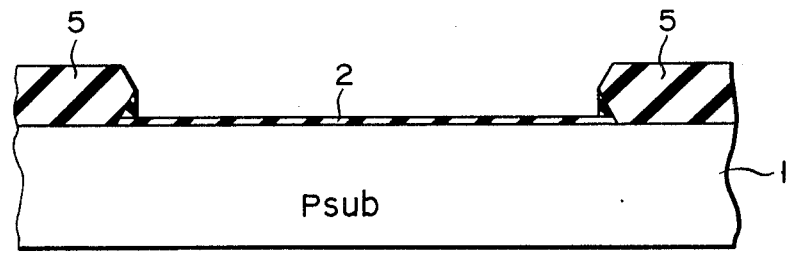

Process 3 (FIG. 1C)

The silicon nitride film 4 is removed by a PE process. Also, the part of the polysilicon layer 3 not oxidized is removed by a reactive or anisotropic ion etching (RIE) process so that the field oxidation film or isolation film 5 having a patterned hole is formed. The patterned hole defines a region on the substrate 1 where an active element is formed later. At this time, the part of the polysilicon layer 3 underlying the birds beak portion of the insulation film 5 is left, because an RIE process is used to etch the polysilicon layer 3.

Figure 1D:
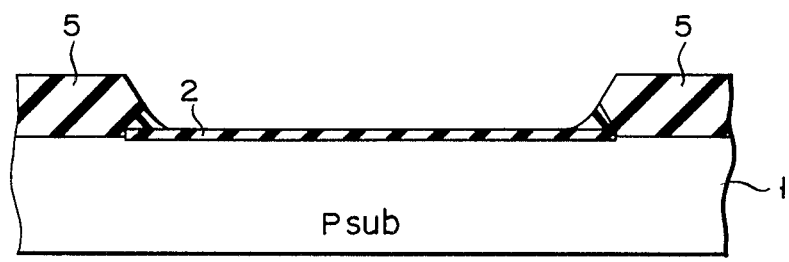

Process 4 (FIG. 1D)

The part of the polysilicon layer 3 underlying the birds beak of the field oxidation film 5 is thermally oxidized. In this oxidation step, the thickness of the exposed part of the oxidation layer 2 is increased. Through the processes 1 to 4 above, the field oxidation film 5 having a side wall of a large step defining the patterned hole is formed.

Figure 1E:
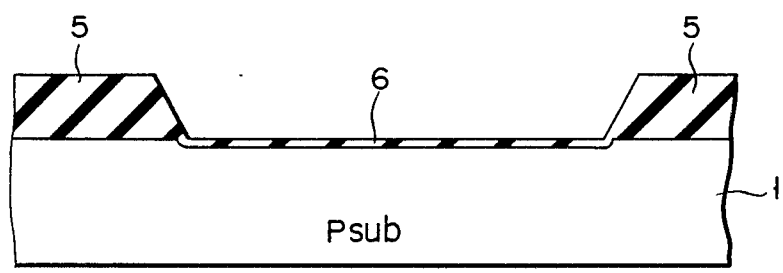

Process 5 (FIG. 1E)

The exposed part of the oxidation layer 2 is removed. After that, a thermal oxidation is done to form a gate oxidation film 6 of about 500 Å in thickness of the substrate 1.

Figure 1F:
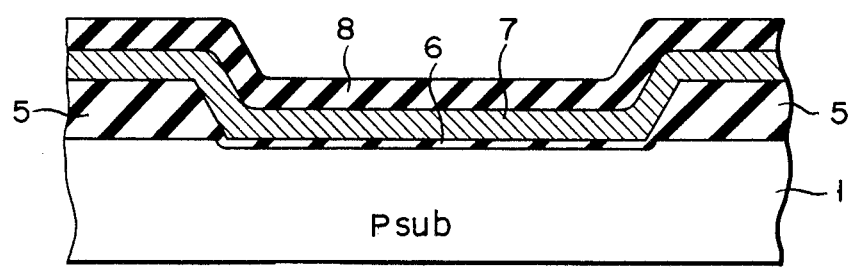

Process 6 (FIG. 1F)

A phosphorus (P)-doped polysilicon layer 7 of about 4,000 Å in thickness is formed over the major surface of the structure and, then, an interlaid insulating layer 8 of $SiO_2$, for example, of about 4,000 Å in thickness is formed on the polysilicon layer 7, by a CVD process.

Figure 1G:
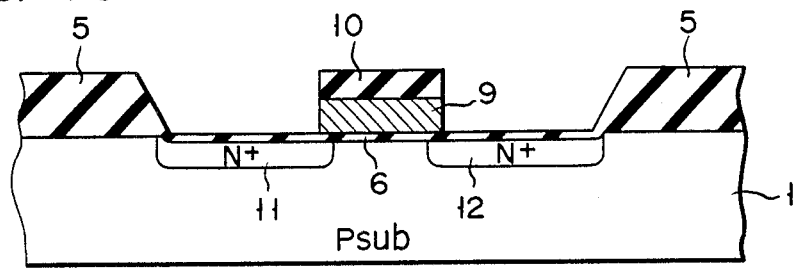

Process 7 (FIG. 1G)

The insulation layer 8 and polysilicon layer 7 are successively patterned using an RIE process, thereby forming a gate electrode 9 with an insulating film 10 formed thereon. A continuous side wall of the gate electrode 9 and insulating film 10 has a large step. Thereafter, an arsenic (As) ion is heavily implanted into the substrate 1 using the insulation film 10 as a mask, thereby forming N= conductivity source and drain regions 11 and 12 of a heavy impurity concentration in the substrate 1.

Figure 1H:
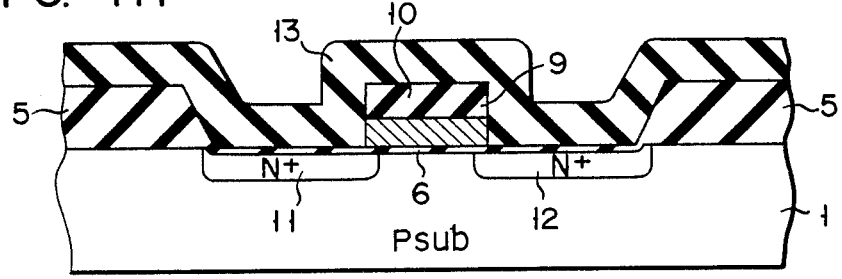

Process 8 (FIG. 1H)

An interlaid insulating layer 13 of $SiO_2$, for example, of about 6,000 Å in thickness is formed over the major surface of the structure using a CVD process.

Figure 1I:
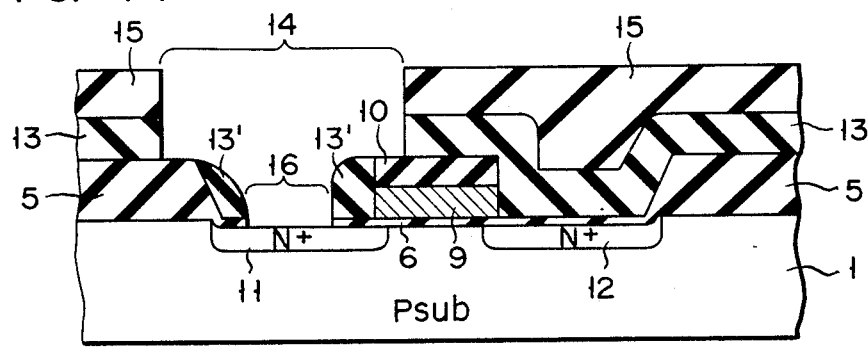

Process 9 (FIG. 1I)

A patterned photoresist film 15 with a hole is formed using a photoresist coating process and a PE process. The hole is located on a region 14 of the insulating film 13 where a contact hole 16 is formed later. The insulating film 13 and gate oxidation film 6 are subjected to an RIE process through the hole in the photoresist film 15, thereby forming the contact hole 16 in the region 14 leading to the substrate. In this case, part 13' of the insulating films 13 is left on the side walls of the field oxidation film 5, gate electrode 9 and insulating film 10.

Figure 1J:
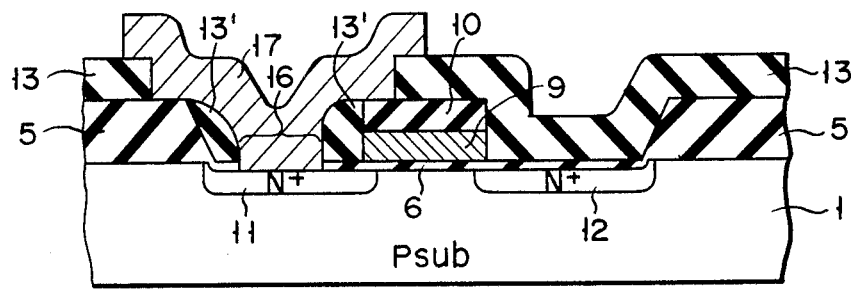

Process 10 (FIG. 1J)

The photoresist film 15 is removed. Thereafter, aluminium (Al) is deposited over the major surface of the structure, thereby forming an aluminium film thereon. The aluminium film is patterned, thereby forming an aluminium electrode 17 contacting the N+ source region 11.

As clearly understood from the above, with the manufacturing method of the invention, the field oxidation film 5 having a side wall of a large step and the structure having a side wall of a large step comprising the gate electrode 9 and oxide region 10 are first formed, next the oxide layer 13 is formed over the major surface of the structure, and thereafter the region 14 of the oxide film 13 corresponding to the contact hole 16 is etched using an RIE process. Therefore, the contact hole 16 is formed in self-alignment with the field oxidation film 5 and the structure of the gate electrode 9 and oxidation region 10.

Therefore, a margin is not required for the wafer for compensating the displacement on masking when the contact hole 16 is formed. This increases the packing density of the elements formed in the wafer.

An example will now be given for explaining the result of the manufacturing method of the invention. FIG. 2 shows a pattern of a portion of an MOS dynamic RAM (random access memory) at a step, in which a contact hole is formed, of the prior art manufacturing method. FIG. 3 also shows a pattern of a portion of an MOS dynamic RAM at a step, in which a contact hole is formed, of the manufacturing method according to the invention. In FIGS. 2 and 3, a pair of gate electrodes or work lines 21 are extended in parallel. A common drain region 22 is located between the pair of word lines 21. A contact hole 23 is formed through an interlaid insulating film (not shown). A reference numeral 24 shows source regions.

With the prior art method, the margin of about 0.6 $\mu$m in width is generally required when the contact hole 23 is formed in accordance with 2 $\mu$m rule. Therefore, taking this margin into consideration, a distance of about 4.4 $\mu$m in width is required between the pair of word lines 21. While, with the manufacturing method of the invention, the contact hole 23 is formed in self-alignment with the field oxidation film 5 and the structure of gate electrodes 21 and oxide films formed thereon (not shown). Therefore, a margin is not required for the wafer when the contact hole 23 is formed, and a distance of only about 2 $\mu$m in width is required between the pair of gate electrodes 21. As will be clear, the distance required between the gate electrodes 21 when the manufacturing method of the invention is applied is shortened by 2.4 $\mu$m to that when the prior art manufacturing method is applied. This increases the packing density of the elements formed in the wafer.

As will be understood from above, with the manufacturing method of the invention, no margin is required for the wafer for compensating for the displacement on masking when a contact hole is formed. Therefore, a high packing density can be obtained.

What is claimed is:

1. A method of manufacturing a semiconductor device comprising the steps of:
   (a) forming on a top surface of a semiconductor substrate of a first conductivity type an isolation film having a patterned hole, defining an active element region on the substrate, the side walls of said patterned hole being relatively thick;
   (b) forming a gate insulating film on said active element region of said substrate;
   (c) forming an electrically conductive layer over said top surface of said semiconductor substrate;
   (d) forming a first insulating layer on said conductive layer;
   (e) patterning said first insulating layer and conductive layer using a reactive ion etching process, thereby forming on said active element region a gate electrode with a first insulation film superposed thereon, the continuous side wall of said gate electrode and first insulation film being relatively thick;
   (f) implanting an impurity ion into said semiconductor substrate using said first insulating layer as a mask, thereby forming an impurity diffused region of a second conductivity type in said semiconductor substrate;
   (g) forming a second insulating layer over said top surface of said semiconductor substrate;
   (h) applying a reactive ion etching process to said second insulating layer, thereby forming a contact hole in said second insulating layer leading to said impurity diffused region, while leaving part of said second insulating layer on said side walls of said isolation film, gate electrode and first insulating layer; and
   (i) forming an electrically conductive film in contact with said impurity diffused region.

2. A manufacturing method according to claim 1, wherein said isolation film is formed by that a polysilicon layer is formed over the major surface of said substrate, and that the polysilicon layer is locally oxidized.

3. A manufacturing method according to claim 1, wherein said element separating film has a thickness of about 5,000 Å.

4. A manufacturing method according to claim 1, wherein said gate electrode has a thickness of about 4,000 Å and said first insulation film has a thickness of about 4,000 Å.

* * * * *